(12) United States Patent
Ilic

(10) Patent No.: US 11,734,103 B2
(45) Date of Patent: *Aug. 22, 2023

(54) BEHAVIOR-DRIVEN DIE MANAGEMENT ON SOLID-STATE DRIVES

(71) Applicant: Microsoft Technology Licensing, LLC, Redmond, WA (US)

(72) Inventor: Jelena Ilic, Aliso Viejo, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/843,345

(22) Filed: Jun. 17, 2022

(65) Prior Publication Data

US 2022/0327018 A1 Oct. 13, 2022

Related U.S. Application Data

(63) Continuation of application No. 16/716,277, filed on Dec. 16, 2019, now Pat. No. 11,366,714.

(51) Int. Cl.
*G06F 11/07* (2006.01)
*G11C 29/04* (2006.01)

(52) U.S. Cl.
CPC ........ *G06F 11/0793* (2013.01); *G06F 11/073* (2013.01); *G11C 29/04* (2013.01)

(58) Field of Classification Search
CPC ............... G06F 11/0727; G06F 11/073; G06F 11/0751; G06F 11/076; G06F 11/0793; G06F 11/2094; G06F 11/3034; G06F 11/3055; G06F 12/0246; G06F 2201/81; G11C 29/04
See application file for complete search history.

(56) References Cited

U.S. PATENT DOCUMENTS

| | | | |
|---|---|---|---|
| 8,312,349 B2* | 11/2012 | Reche ................. | G06F 11/0793 714/6.13 |
| 9,170,897 B2* | 10/2015 | Losh ................... | G06F 11/1068 |
| 9,594,611 B2* | 3/2017 | Hashimoto ......... | G06F 11/1417 |
| 11,340,979 B2* | 5/2022 | Aklik .................... | G11C 29/52 |

* cited by examiner

*Primary Examiner* — Joseph R Kudirka

(57) ABSTRACT

Systems, methods, and software are disclosed herein that enhance the management of storage sub-systems with solid-state media. In various implementations, a method comprises collecting time series data indicative of an accumulation of bad blocks within dies on one or more solid-state drives. For one or more of the dies, the method includes identifying one or more behaviors of a die based at least on a portion of the time series data associated with the die and determining to retire the die based at least on one or more identified behaviors of the die. One or more of the dies on the one or more solid-state drives may then be retired accordingly.

20 Claims, 10 Drawing Sheets

BEHAVIOR-DRIVEN DIE MANAGEMENT ON SOLID-STATE DRIVES

CROSS-REFERENCE TO RELATED APPLICATIONS

This application claims priority to and benefit from U.S. patent application Ser. No. 16/716,277, and corresponding U.S. Pat. No. 11,366,714, titled "BEHAVIOR-DRIVEN DIE MANAGEMENT ON SOLID-STATE DRIVES" filed on Dec. 16, 2019, the content of which is expressly incorporated by reference in its entirety for all purposes herein.

TECHNICAL FIELD

Aspects of the disclosure are related to the field of computing hardware and software and in particular to data storage devices, systems, and sub-systems.

TECHNICAL BACKGROUND

Solid-state drives (SSDs) have become ubiquitous in the modern computing world. Employed in a range of computing devices from mobile phones to servers, solid-state drives (and their hybrid relatives) provide increasingly fast and reliable storage that make them popular for all types of computing workloads.

A representative solid-state drive includes a set of memory devices for storing data persistently, and a controller that controls the flow of data to and from the memory devices and on and off the drive. The memory devices each include one or more dies and each die can be logically sub-divided into blocks. The blocks on a given die are grouped together in planes. That is, a given die includes one or more planes and each plane includes a set of blocks.

The blocks on a die are themselves comprised of a matrix of strings and pages, and the strings and pages are comprised of individual cells. A single cell stores a charge that, depending on its value, represents a certain state. A cell can thus be programmed (or erased) by charging (or not charging) the cell to varying degrees, depending on the type of cell. A single level cell can store one bit, a multi-level cell stores two, and a triple-level cell stores three.

Regardless, individual cells can have defects and/or can wear out over time and with repeated use. Defects and wear, if significant enough, lead eventually to blocks going bad on a die. If the number of bad blocks on a die exceeds a threshold number, the die can be retired by relocating its data and marking all of its blocks as unusable.

Unfortunately, such a coarse approach can result in at least two undesirable—and potentially unnecessary—outcomes. In one example, a deployed drive may reduce its capacity by retiring a die that may have continued to perform well regardless of its bad block count. In another example, an excessive bad block count detected at the time of manufacture may cause a drive to be returned as defective even though it would likely perform well in the field.

OVERVIEW

Technology is disclosed herein that enhances the management of storage sub-systems with solid-state media (e.g. solid-state drives and hybrid drives) by managing dies based on their behavior as exhibited in telemetry data, as opposed to a coarse thresholding approach. In various implementations, a method comprises collecting time series data indicative of an accumulation of bad blocks within dies on one or more solid-state drives. For one or more of the dies, the method includes identifying one or more behaviors of a die based at least on a portion of the time series data associated with the die and determining to retire the die based at least on one or more identified behaviors of the die. One or more of the dies on the one or more solid-state drives may then be retired accordingly.

Such behavior-driven die retirement as disclosed herein may be implemented on a drive, on a host, on a server, or distributed between or amongst a combination thereof. The technology may be implemented entirely in hardware, entirely in software (including firmware, resident software, micro-code, etc.), or as a combination of hardware and software.

In some implementations, the method includes training a machine learning model on historical telemetry data collected from multiple drives. The trained model may then be fed at runtime with telemetry data associated with dies, allowing the model to identify behavior(s) that factor(s) into retirement determinations made with respect to the die(s).

A representative machine learning model may be trained and deployed in the context of one or more data centers, although the machine learning model may also be deployed locally with respect to a drive—and even trained locally if so desired. For instance, a representative model could be deployed in the controller of a solid-state drive, in a host associated with a drive, or in a server associated with a drive. The model may be implemented in hardware, software, or a combination thereof. Example models include—but are not limited to—artificial neural networks, random forest models, and decision tree models.

This Overview is provided to introduce a selection of concepts in a simplified form that are further described below in the Technical Disclosure. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure may be better understood with reference to the following drawings. The components in the drawings are not necessarily to scale, emphasis instead being placed upon clearly illustrating the principles of the present disclosure. Moreover, like reference numerals in the drawings designate corresponding parts throughout the several views. While several implementations are described in connection with these drawings, the disclosure is not limited to the implementations disclosed herein. On the contrary, the intent is to cover all alternatives, modifications, and equivalents.

DETAILED DESCRIPTION

Figure 1:
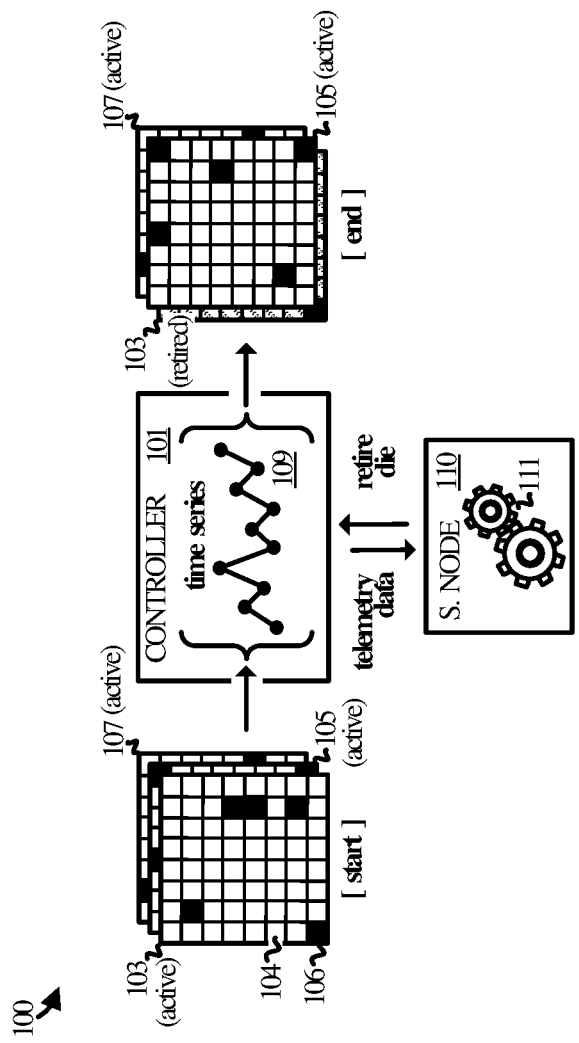
FIG. 1 illustrates an operational environment and related scenario in an implementation of behavior-driven die management.

Technology disclosed herein relates to systems and methods for managing dies on solid-state drives based on their behavior as determined from telemetry data gathered from the drives. The telemetry data in one or more implementations includes time series data indicative of an accumulation of bad blocks within dies on one or more solid-state drives. The time series data is analyzed to identify one or more behaviors of a given die instead of—or in addition to—considering whether a count of bad blocks on the die has met or exceeded a threshold. A behavior may indicate, for example, an unacceptable rate of increase of bad blocks on a die. A determination to retire the die (or keep it alive) is then made based on the identified behavior(s).

Various technical effects may be appreciated from the present disclosure. For example, an unacceptable rate of increase of bad blocks on a die may trigger the retirement of the die even-if the threshold number of bad blocks has yet to be reached. Taking the die out of service reduces the capacity of the drive, but also mitigates the risk of data loss and other failures. In a different scenario, an acceptable rate of increase of bad blocks on a die allows the die to remain in-service, even when a threshold number of bad blocks has been exceeded. Such capabilities extend the life of the die, which preserves the capacity of the drive.

As mentioned, the telemetry data includes time series data on the accumulation of bad blocks. The time series data may indicate the location of a die on a drive by its channel and logical unit number (LUN), as well as a count or quantity of bad blocks on the die at periodic moments in time. The telemetry data may also include other time series data drawn from the internal logs of a drive, logs maintained by a host, or server logs (e.g. error logs).

The time series data thus provides a signal that can be analyzed by a supervisory node to identify the behavior of an associated die. The supervisory node may employ a discrete, rules-based analysis of the time series data. For example, the supervisory node could calculate the rate of increase of bad blocks from the time series data and determine to retire the die if the rate of increase exceeds a threshold. This may be instead of, or in addition to, analyzing the raw bad block count. Alternatively—or in combination with a rules-based approach—the supervisory node could employ a machine learning model that ingests the time series data and outputs an indication of the behavior of the die.

In the case of a machine learning model, the model may be trained on historical telemetry data gathered from multiple drives deployed in one or more environments. The telemetry data would include the same or similar time series data as that available on the drives with respect to which the model is deployed. The training data may also include classification data that characterizes or describes the operational state of a die correlated with time, such as whether the die continues to operate normally, sub-standardly, or otherwise. The model can also be trained continuously with new telemetry data produced by the drives under its governance. Thus, the machine learning model is able to predict die failure and therefore cause the die to be taken out of service (retired) before its failure causes other problems, but not so soon as to reduce the capacity of the drive unnecessarily.

The machine learning model, examples of which include artificial neural networks (e.g. recurrent neural networks and convolutional neural networks), random forests, and decision trees, may be deployed in a variety of supervisory nodes and environments. The model may run locally in the controller of a drive, for example, as well as on a host, on a server (local or in the cloud), or even in off-controller hardware on a drive.

Referring now to the drawings, FIG. 1 illustrates an operational environment 100 and a related operational scenario in an implementation. Operational environment 100 includes controller 101 and supervisory node 110. Controller 101 interfaces with supervisory node 110 to manage one or more of a set of dies represented by die 103, die 105, and die 107.

Controller 101 is representative of one or more hardware and/or software elements in a storage sub-system (e.g. a solid-state drive or a hybrid solid-state/disk drive) capable of controlling the flow of data to and from solid state storage media. Controller 101 is also capable of communicating telemetry data to a supervisory node on a host or a server, as well as to a supervisory node internal to the drive itself or implemented in controller 101.

Supervisory node 110 employs model 111 to manage dies 103, 105, and 107 based on their overall behaviors. Model 111 is representative of any machine learning model (or models) suitable for intaking telemetry data and providing identified behaviors as output. Model 111 may in some cases output a determination to retire a die instead of—or in addition to—classifying the behavior of the die. Examples of model 111 include artificial neural networks (e.g. recurrent neural networks and convolutional neural networks), random forests, and decisions trees. Model 111 may be trained on historical telemetry data collected from a group of solid-state and/or hybrid drives such as those deployed in one or more data centers.

Each die, of die 103, die 105, and die 107 is representative of a die on a solid-state memory device, examples of which include NAND flash memory devices, NOR flash memory devices, DRAM-type memory devices, and the like. The devices may be two-dimensional or three-dimensional and their cells may be capable of storing one or more bits per cell (e.g. one bit for single-level cells; two bits for multi-level cells; three bits for triple-layer cells, and so on).

A given memory device includes at least one die, but often two or more dies. Each die is sub-divided into one or more planes and each plane includes a group of blocks. Each block is comprised of a number of cells connected together in strings and pages. Some cells may start out as defective, while other cells may wear out over time, eventually causing an associated block to go bad. As more and more blocks on a single die fail, the accumulation of bad blocks reduces the effectiveness of the die to such an extent that the overall operation of the drive would benefit from the die being retired. But as mentioned, a coarse threshold approach has the potential to remove a die from service unnecessarily and/or prematurely.

Figure 2:
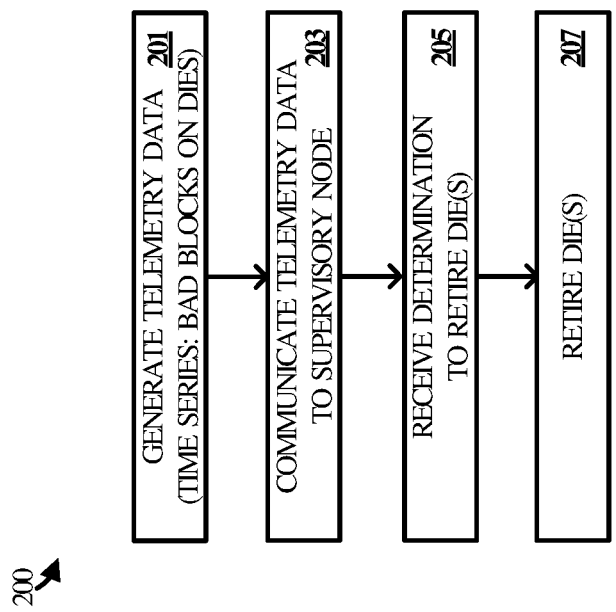
FIG. 2 illustrates a drive-side die management process in an implementation.
Figure 3:
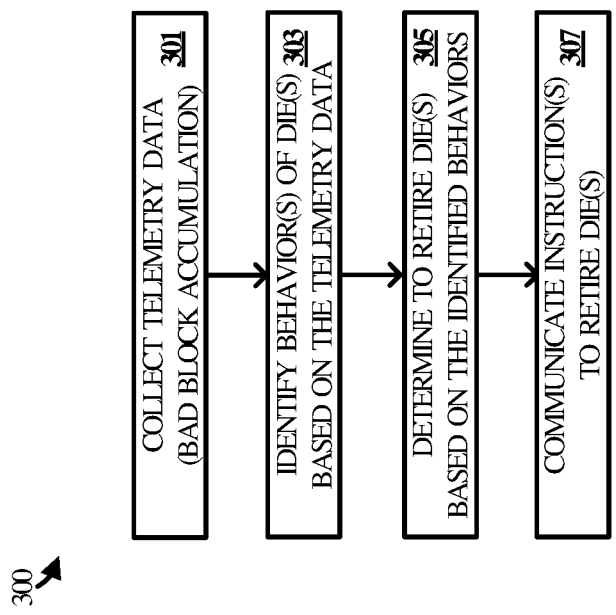
FIG. 3 illustrates a supervisory-side management process in an implementation.

To mitigate the risk of retiring a die too early, die management process 200 and die management process 300 illustrated in FIG. 2 and FIG. 3 respectively may be employed. Die management process 200 may be implemented in the hardware, software, or firmware elements of a controller and/or other such component(s) of a storage sub-system (e.g. a solid-state or hybrid drive). A controller configured in accordance with die management process 200 operates as follows, referring parenthetically to the steps in FIG. 2.

To begin, the controller generates or otherwise obtains telemetry data indicative of one or more operational metrics of the drive (step 201). The telemetry data may include, for example, time series data descriptive of the number of bad blocks recorded periodically with respect to one or more of the dies on the drive. The telemetry data may also include: a total number of uncorrectable errors per read grown defect (bad block); read recovery statistics (counters of read recovery levels per physical die); program erase cycles per SSD-type redundant array of inexpensive disks (referred herein to as RAID) block; a list of grown defects (identified by RAID block, physical and/or logical unit number, channel, and reason—read, program, erase); and total accumulated uncorrectable read errors and program erase cycles per-block.

The controller then communicates the telemetry data to a supervisory node (step 203). The supervisory node may be external to the drive, in which case the controller communicates the telemetry data over a local connection (e.g. SAS, SATA, and PCIe), a network connection (e.g. Ethernet and TCP/IP), or the like, including any suitable combination or variation thereof. In other implementations, the supervisory node may be internal to the drive, in which case the supervisory node may be granted access to a location where the data resides, or the data may be moved from one location in memory to another that is accessible to the supervisory node.

The supervisory node analyzes the telemetry data and, under some circumstances discussed with respect to FIG. 3, returns a determination to retire a given die. The controller receives the determination (step 205) and proceeds to retire the identified die. The determination may be received by the controller in the form of a command communicated by the supervisory node in accordance with a standard management protocol such as non-volatile memory express (NVMe). In other cases, the command may be formatted and communicated in accordance with a vendor-specific protocol. The controller retires the die by first re-locating all of its data to one or more other dies on the drive and then marking all of the blocks on the die as unusable.

Die management process 300 in FIG. 3 may be implemented in the hardware, software, and/or firmware components of a supervisory node, examples of which include a host sub-system, a server, and the like. A supervisory node configured in accordance with die management process 300 operates as follows, referring parenthetically to the steps in FIG. 3.

In operation, the supervisory node collects telemetry data from one or more drives (step 301). The telemetry data includes, for example, times series data indicative of the accumulation of bad blocks on one or more dies over time.

The supervisory node then processes the data to identify one or more behaviors of one or more of the dies (step 303). Processing the telemetry data may involve, for example, submitting at least a portion of the time series data as input to a machine learning model capable of providing an output indicative of die behavior. The output may be a prediction in some implementations of various possible failures such as grown defects associated with uncorrectable read errors, physical die failure as a function of the grown defect rate, program/erase cycles, and time. For example, a significant increase in the grown defect (bad block) rate in short period of time and/or relatively small program/erase cycle interval on a single physical die may result in a prediction of the failure of that die. In other examples, processing the telemetry data may involve performing discrete calculations and comparing the results to thresholds. The supervisory node may, for instance, calculate the rate of increase of bad blocks on a die and compare the result of the calculation to a threshold so as to characterize the behavior of the die in terms of its rate of bad block accumulation.

Regardless of how the behavior of a given die is determined, the supervisory node next determines to retire a given die based on its identified behavior (step 305). Certain behaviors may map to certain retire determinations such that the supervisory node merely resolves to map an identified behavior to its corresponding retire determination. Alternatively, the output of a machine learning model could be a recommendation or determination to retire a die (or to keep the die in-service) as opposed to outputting an identified behavior.

Upon reaching a decision, the supervisory node communicates an instruction to retire a die (or to keep the die alive) to the target drive (step 307). The instruction may be communicated in accordance with NVMe or other such standardized or proprietary protocols and is implemented by the target drive upon receipt.

Referring back to FIG. 1, operational environment 100 illustrates a brief scenario in an implementation of die management process 200 and die management process 300. In this scenario, controller 101 is configured in accordance with die management process 200. Controller 101 generates telemetry data, which includes time series data 109 indicative of the number of bad blocks on die 103, correlated with time. The time series data 109 may also include data indicative of the bad block count on die 105 and die 107, although this scenario focuses on die 103 for exemplary purposes. Block 104 on die 103 represents a block in a normal state, whereas block 106 with black fill represents a defective block. All three dies are active at the start of this exemplary scenario.

Controller 101 sends the telemetry data to supervisory node 100. Supervisory node 110 provides at least a portion of the data as input to model 111. Model 111, having been trained on historical telemetry data, ingests the time series data and outputs a classification of the behavior of die 103. Supervisory node 110 also determines whether to retire a die based on the identified behavior and—if so—returns an instruction to controller 101. It is assumed for exemplary purposes that die 103 is to be retired. As such, supervisory node 110 communicates a command to controller 101 to retire die 103. Controller 101 receives the command and responsively retires die 103. Die 103 is depicted behind die 105 and die 107 and with shading to represent its retired state, as opposed to the active state of its counterparts.

Figure 4:
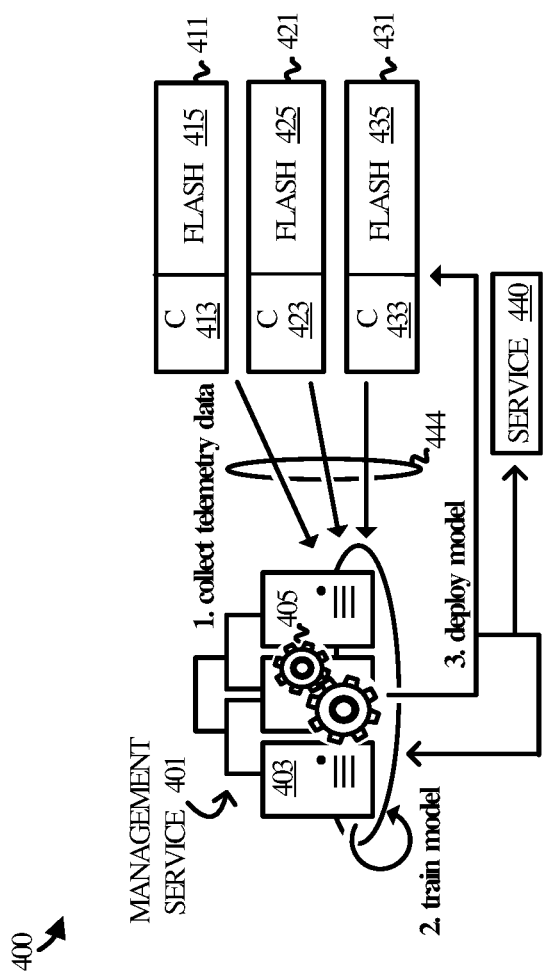
FIG. 4 illustrates a training environment and related scenario in an implementation.

FIG. 4 illustrates a training environment 400 and related scenario in another implementation. Training environment 400 includes a management service 401 and an assortment of solid-state drives, represented by solid-state drive 411, solid-state drive 421, and solid-state drive 431. Each solid-state drive comprises a controller and flash media. For instance: solid-state drive 411 includes controller 413 and flash media 415; solid-state drive 421 includes controller 423 and flash media 425; and solid-state drive 431 includes controller 433 and flash media 435.

Management service 401 is implemented in software on one or more computing devices in a data center environment, for example computing device 403. Computing device 403 may be any suitable type of computer having an architecture the same or similar to computing device 901 illustrated in FIG. 9. Management service 401 is capable of training a machine learning model on historical telemetry data from solid-state drives such that the model can be employed against live telemetry data. Optionally, management service 401 may also be capable of hosting the trained model and performing management functions with respect to the drives within its purview.

FIG. 4 illustrates a brief operational scenario that begins with management service 401 collecting telemetry data from one or more drives, e.g. solid-state drives 411, 421, and 431. The telemetry data may be collected from the drives themselves, from a historical repository, or both. In fact, the historical telemetry data need not have been produced by or even associated specifically with solid-state drives 411, 421, and 431, but rather could be comprised of telemetry data from other drives.

Management service 401 uses the telemetry data to train model 405. The telemetry data includes at least some time series data indicative of bad block states on the dies of its subject drives, although other data is also possible. That is, any metrics available on the solid-state drives may be included in the telemetry data such as utilization metrics, performance metrics, activity metrics, and the like. Higher-level usage metrics or statistics may also be available such as a record of the types of data or objects stored on the drives. Such information may be included in the telemetry data in addition to the bad block tracking information.

In addition to collecting the historical telemetry data, training model 405 may also include a classification step to classify the state of a drive, a die, or the like. The classification step may be automated, semi-automated, or manual. In some cases, the state of a drive or die may be evident from the telemetry data and thus may be derived automatically from the telemetry data. In other cases, other records may be examined in an automated, semi-automated, or manual fashion to generate the classifications.

It may be appreciated that the telemetry data in its received format may not be suitable for training or inputting to model 405. Rather, management service 401 first vectorizes the telemetry data. Vectorizing the telemetry data includes extracting specific metrics from the telemetry data and arranging and formatting the metrics in a vector format ingestible by model 405. The classifications may also be vectorized.

Once model 405 is trained, management service 401 can deploy the model to one or more of a variety of locations or environments where die management process 300 runs to be employed against live telemetry data. For instance, instances of model 405 can be deployed in solid-state drives 411, 421, and 431. One or more instances of model 405 may also be deployed within the context of management service 401 and/or within the context of some other service, represented by service 440.

Management service 401 may continue to collect telemetry data from drives in real-time such that model 405 can be continuously updated. Updates to model 405 can be distributed to the various locations where it is employed. Optionally, model 405 (or instances thereof) can be trained in-place using local telemetry data. For example, an instance of model 405 deployed on a server, host, or drive can be trained on the server, host, or drive. In some cases, the instance of model 405 may be deployed in a drive but trained in the context of the host computer or server associated with the drive.

Figure 5A:
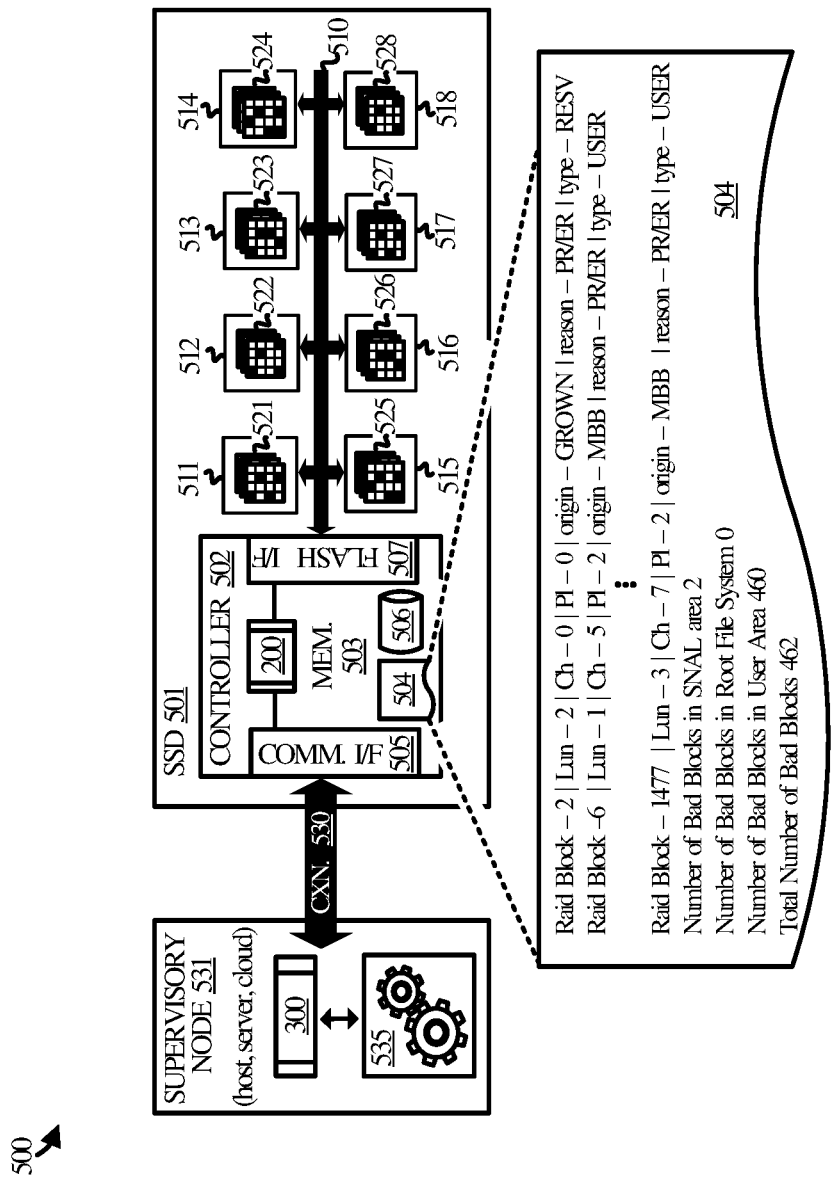
FIGS. 5A-5B illustrate an operational architecture in an implementation.
Figure 5B:
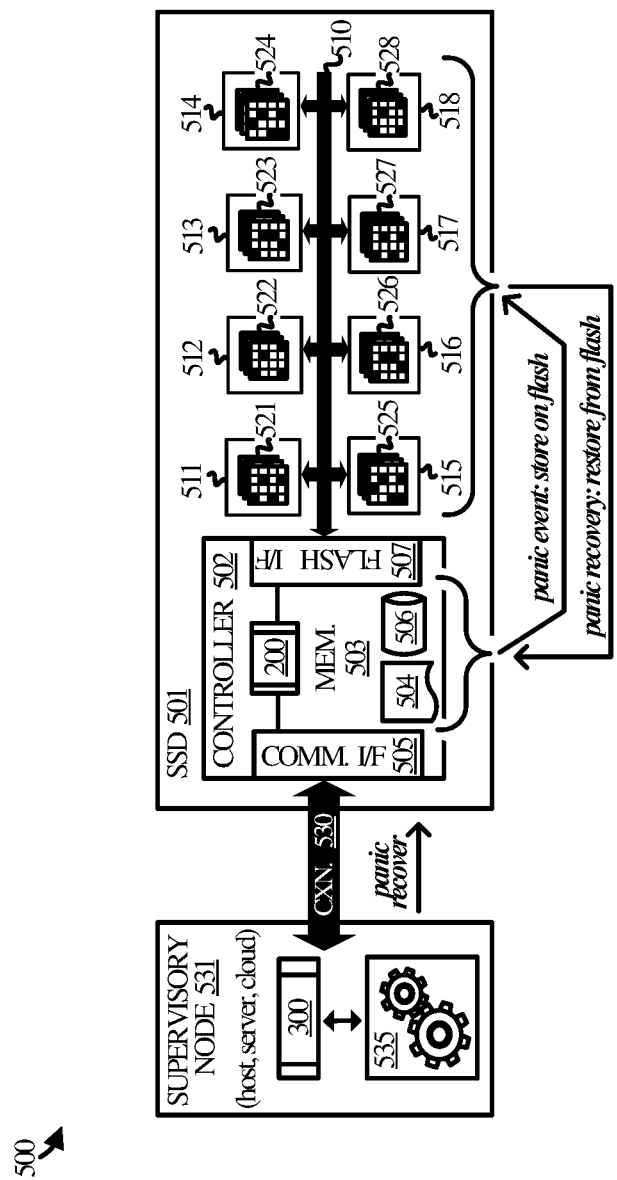

FIG. 5A and FIG. 5B illustrate a deployment environment 500 in an implementation of enhanced die management. Referring to FIG. 5A, deployment environment 500 includes solid-state drive 501 and supervisory node 531. Solid-state drive 501 communicates with supervisory node 531 over a local connection, a network connection, or the like, represented by connection 530. Examples of connection 530 include SAS, SATA, PCIe, and Ethernet connections. Supervisory node 531 may be implemented on suitable computing device having an architecture the same as or similar to that of computing device 901 in FIG. 9.

Solid-state drive 501 includes controller 502 and flash devices 511, 512, 513, 514, 515, 516, 517, and 518. Controller 502 is comprised of one or more processors and includes memory 503, communication interface 505, and flash interface 507. Flash devices 511, 512, 513, 514, 515, 516, 517, and 518 each include a set of dies represented by die groups 521, 522, 523, 524, 525, 526, 527, and 528 respectively. Controller 502 communicates with flash devices 511-518 over one or more read/write channels, represented by channel 510.

Controller 502 includes a software and/or firmware implementation of die management process 600 stored in memory 503 that may be executed by the one or more processors of controller 502. In addition to die management process 600, memory 503 also includes a table 504, to which controller 502 can write bad block data, and a log 506 of other operational data such as error events and the like. Controller 502 loads table 504 from flash into memory 503 upon power-up and is able to store table 504 back to flash. Referring to FIG. 5B, controller 502 can store table 504 and/or log 506 on flash in response to a panic event (e.g. catastrophic failures) and recover from flash when instructed by a host.

The grown defects and P/E cycle information in table 504 are power safe structures that may be restored during panic recovery. Panic happens on the drive due to firmware asserts and other catastrophic failures. When SSD 501 is in this state, a host has an option to issue a panic recovery command. When SSD 501 is recovered from panic mode, it is reinitialized to its manufacturing state, which wipes out information about P/E cycles and grown bad blocks in memory 503. This may be problematic for machine learning models if they are trained on incorrect data sets. To mitigate this problem, the telemetry data in table 504 is saved to the flash NAND during a panic event and restored from the NAND flash to the DRAM on controller 501 during panic recovery. In this manner, the telemetry data is not lost during the lifetime of the drive and a given model can be trained with correct data sets Read recovery statistics are also power safe since there is little to no value of having them restored during the panic recovery. In two stages of read recovery, when RAID recovery succeeds and scan retry succeeds, firmware marks a block as a grown defect due to read errors. Relocation and recycling of this defect is a background firmware task. Since machine learning models will be trained using read recovery statistics, the resulting prediction can indicate earlier that a block will hit recovery level, RAID, or Scan retry, in which case the erase block will be marked as grown defect. If the model can predict earlier that the block will be marked as bad, firmware can schedule the block for relocation and recycling earlier. Therefore, proactive block retirement can be completed sooner. In addition, if there a is random read coming from a host, there will also be less and/or no delay caused due to the relocation and recycling of the grown defect, thereby improving random read performance.

Figure 6:
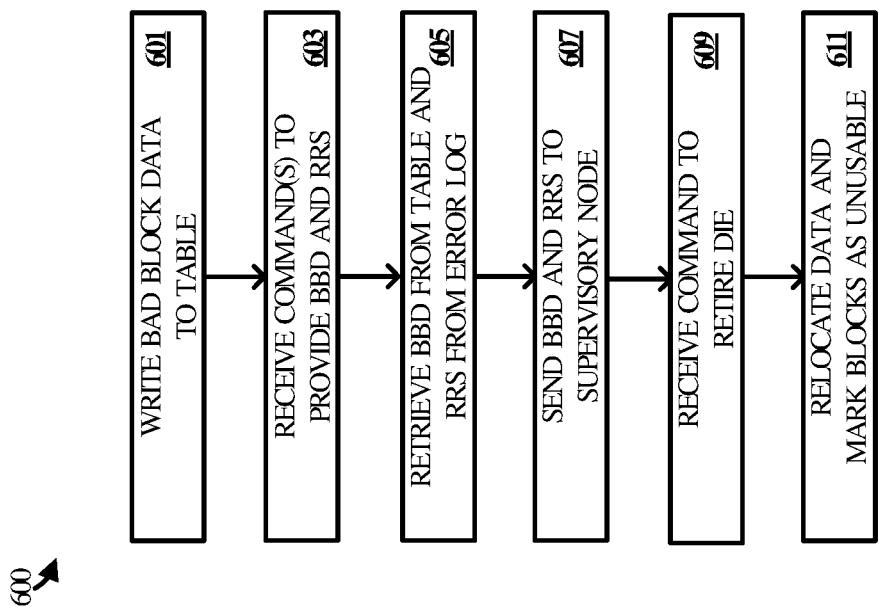
FIG. 6 illustrates a drive-side die management process in an implementation.
Figure 7:
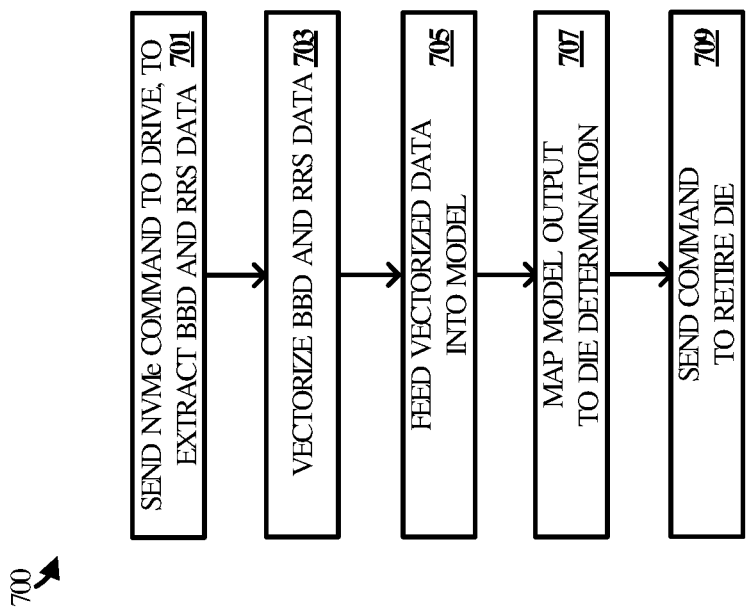
FIG. 7 illustrates a supervisory-side management process in an implementation.

Controller 502, under the control of die management process 600, operates as follows, referring parenthetically to the steps in FIG. 6. To begin, controller 502 writes bad block data to table 504 (step 601). The bad block data may be generated by controller 502 over the course of normal operations. For instance, as controller 502 attempts to read and/or write data with respect to particular blocks, it determines on an ongoing basis which blocks have gone bad such that their data can be relocated to other blocks and/or so that the blocks can be avoided on future writes.

Controller 502 can note in table 504 the identity of those determined to have gone bad, as well as timing information indicative of when the blocks went bad. Table 504 will thus hold time series data that is indicative of a full or partial history of grown bad blocks on solid-state drive 501. Table 504 stores various block-level information about the blocks that have gone bad such as the RAID block to which a given block belongs, a LUN assigned to the block, a channel identifier, a plane identifier, the origin of the problem that caused the block to go bad (e.g. grown or at manufacturing), whether the defect occurred due to erase or program operations, program/erase cycles per RAID block, and a partition identity. Other data that controller 502 may write to log 506 includes die-level read recovery statistics, examples of which include read recovery levels per physical die. Controller 502 may also, in some implementations, generate and store derivative data in table 504 (or elsewhere) that is derived from the aforementioned raw data. Examples of derivative data include variances and means of the raw telemetry data within a window of time within which the raw data is collected and stored.

The data in table 504 and log 506 may be retrieved periodically by supervisory node 531 via an NVMe command, a vendor-unique command (VUC), or any combination or variation thereof. Controller 502 receives the command to provide bad block data (BBD) and read recovery statistical (RRS) data (step 603) and retrieves the requested data from table 504 and log 506 (step 605). The command may request all of the data in table 504 and log 506, only the most recent portions of the data since the last request, or an even smaller subset of the data. Controller 502 communicates the requested data via communication interface 505 to supervisory node 531 (step 607) and supervisory node 531 analyzes the data to make and potentially act upon predictions. It is assumed for exemplary purposes that supervisory node 531 returns a determination to retire a given die.

Controller 502 receives the command (step 609) and proceeds to retire the identified die. The retire command may be an NVMe command, a vendor-unique command, or a combination or variation thereof. Controller 502 retires the die by first re-locating all of its data to one or more other dies on the drive and then marking all of the blocks on the die as unusable (step 611).

Die management process 300 in FIG. 3 may be implemented in the hardware, software, and/or firmware components of supervisory node 531, examples of which include a host sub-system, a server, and the like. Supervisory node 531 configured in accordance with die management process 300 operates as follows, referring parenthetically to the steps in FIG. 3.

In operation, supervisory node 531 sends a command to solid state drive 501 to obtain telemetry data (step 701). Solid-state drive 501 receives the command and responsively returns the data over connection 530. As mentioned, examples of the telemetry data provided by solid state drive 501 include a list of defective blocks correlated with time, the RAID block to which a given block belongs, a LUN assigned to the block, a channel identifier, a plane identifier, the origin of the problem that caused the block to go bad (e.g. grown or at manufacturing), whether the defect occurred due to erase or program operations, program/erase cycles per RAID block, and a partition identity. The telemetry data may also include recovery levels per physical die and derivative data such as variances and means of the raw telemetry data within a window of time for which the telemetry data is obtained.

Next, supervisory node 531 vectorizes the telemetry data (BBD and RRS data) such that it may be submitted to model 535 (step 703). Vectorizing the data may include generating derivative data from the telemetry data. The vectorized data may therefore have as many dimensions as desired to describe the state or behavior of a block, a group of blocks, or a die. As an example, time series data indicative of the bad-block count on a die could be provided as input to a function to produce a derivative time series indicative of a derivative count of bad blocks (e.g. average or multiple), an impulse response, or a distribution analysis.

Supervisory node 531 feeds the vectorized data (and potentially any derivative data) into machine learning model 535 in order to identify one or more behaviors of one or more of the dies (step 705). Machine learning model 535 is representative of any one or more models capable of providing an output indicative of die behavior, which supervisory node 531 maps to a management determination (step 707). The management determination could be to retire a die, retain a die in-service, or the like. Certain behaviors may map to certain retire determinations such that the supervisory node can map an identified behavior to its corresponding retire determination. Alternatively, the output of machine learning model 535 could be a recommendation or determination to retire a die rather than an identified behavior.

The values of the vectorized data fed into machine learning model 535 influence the results produced by the model. As an example, take a case where the program/erase cycles on a RAID block nears the life cycle limit of a given NAND chip. In such circumstances, the feature vectors corresponding to the program/erase cycles may strongly influence the output of the model because it is more likely for defects to occur at the end of the life cycle of a NAND chip that includes one or more dies. Because of this fact, the training data on which machine learning model 535 was trained is likely to include program/erase cycle values strongly correlated in time with grown bad blocks and die failures. Machine learning model 535 will therefore reflect that a high count of program/erase cycles is strongly correlated with the occurrence of defective blocks, leading to predictions of die failure in response to high program/erase cycle counts. In other words, machine learning model 535 is likely to predict die failure in response to telemetry data having high program/erase cycle counts included therein. It may be appreciated that a wide variety of correlations present in the training data may drive machine learning model 535 to predict a number of different behaviors in addition to die failures such as periods of normal performance, declining performance, and the like.

Supervisory node 531 then sends command or instruction to retire a die (or to keep the die alive) to solid-state drive 501 (step 709). The instruction may again be communicated in accordance with NVMe or other such standardized or proprietary protocols and is implemented by solid-state drive 501 upon receipt.

Figure 8:
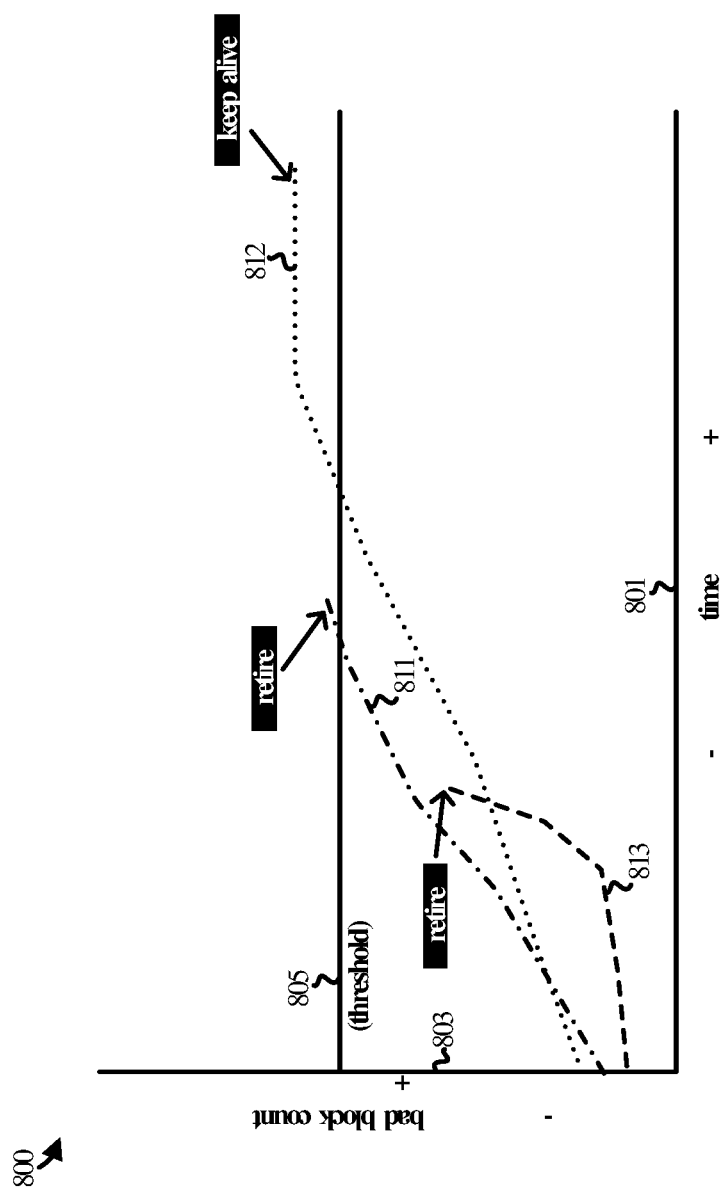
FIG. 8 illustrates an operational scenario in an implementation.

FIG. 8 illustrates a graph 800 of a set of representative time series with management determinations overlaid with respect to the graph. Graph 800 includes an x-axis 801 representative of time and a y-axis 803 representative of bad block count. Three time series are depicted. Each individual time series may represent the bad block count for a different one of a set of dies. For instance: time series 811 represents the bad block count for one die; time series 812 represents the count for another die; and time series 813 represents the count for a third die.

In operation, each of the time series is collected and reported by a controller to a supervisory node in the context of telemetry data that may include other data sets in addition to the bad block counts. The telemetry data is fed by the supervisory node into a machine learning model such as those disclosed in the preceding description.

The machine learning model operates on the telemetry data to produce a failure prediction with respect to each of the dies. The predictions are then used to drive management decisions such as whether to retire a die or keep the die in service. It is assumed here for exemplary purposes that the supervisory node determined to retire the dies associated with time series 811 and time series 813, but to keep in-service the die associated with time series 812.

Threshold 805 is also depicted in graph 800 to contrast the illustrated determinations of the supervisory node. The die associated with time series 811 was retired at or around the same time as it would have been under past thresholding solutions. However, the die associated with time series 812 is kept alive even though it has exceeded the threshold. This means that the die can continue to provide capacity to the drive and for longer than what would have occurred in the past.

Further illustrating such a technical effect, the die associated with time series 813 is retired well before reaching the threshold. In the past, the same die would not have been retired until exceeding the threshold, which may have led to die failure or worse. Pro-actively retiring the die prior to it reaching or exceeding the threshold mitigates the risk of die failure.

Figure 9:
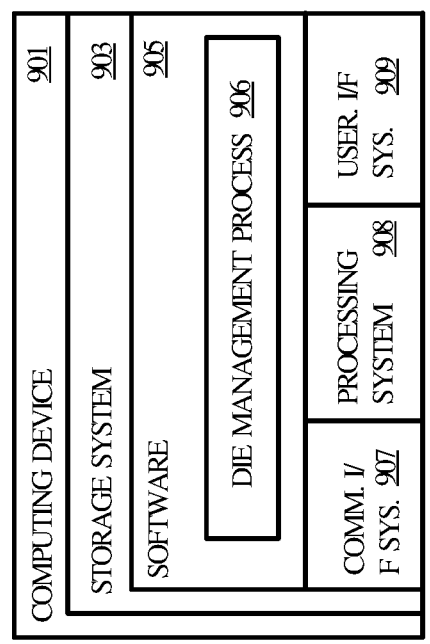
FIG. 9 illustrates a computing device suitable for implementing the various operational environments, related scenarios, processes, and operational architectures discussed below with respect to the Figures.

FIG. 9 illustrates computing device 901 that is suitable for implementing some or all aspects of the various processes, programs, services, and scenarios disclosed herein. Examples of computing device 901 include, but are not limited to, server computers, cloud computing platforms, switches and other data center equipment, solid-state drives, and hybrid drives, as well as any other type of physical or virtual server machine, container, and any variation or combination thereof.

Computing device 901 may be implemented as a single apparatus, system, or device or may be implemented in a distributed manner as multiple apparatuses, systems, or devices. Computing device 901 includes, but is not limited to, processing system 908, storage system 903, software 905, communication interface system 907, and user interface system 909. Processing system 908 is operatively coupled with storage system 903, communication interface system 907, and user interface system 909.

Processing system 908 loads and executes software 905 from storage system 903. Software 905 includes and implements die management process 906, which is representative of the die management processes discussed with respect to the preceding Figures. When executed by processing system 908 to enhance the user experience with respect to content capture experiences, software 905 directs processing system 908 to operate as described herein for at least the various processes, operational scenarios, and sequences discussed in the foregoing implementations. Computing device 901 may optionally include additional devices, features, or functionality not discussed for purposes of brevity.

Referring still to FIG. 9, processing system 908 may comprise a micro-processor and other circuitry that retrieves and executes software 905 from storage system 903. Processing system 908 may be implemented within a single processing device but may also be distributed across multiple processing devices or sub-systems that cooperate in executing program instructions. Examples of processing system 908 include general purpose central processing units, graphical processing units, application specific processors, and logic devices, as well as any other type of processing device, combinations, or variations thereof.

Storage system 903 may comprise any computer readable storage media readable by processing system 908 and capable of storing software 905. Storage system 903 may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 903 may also include computer readable communication media over which at least some of software 905 may be communicated internally or externally. Storage system 903 may be implemented as a single storage device but may also be implemented across multiple storage devices or sub-systems co-located or distributed relative to each other. Storage system 903 may comprise additional elements, such as a controller, capable of communicating with processing system 908 or possibly other systems.

Software 905 (including die management process 906) may be implemented in program instructions and among other functions may, when executed by processing system 908, direct processing system 908 to operate as described with respect to the various operational scenarios, sequences, and processes illustrated herein. For example, software 905 may include program instructions for implementing a die management process as described herein.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 905 may include additional processes, programs, or components, such as operating system software, virtualization software, or other application software. Software 905 may also comprise firmware or some other form of machine-readable processing instructions executable by processing system 908.

In general, software 905 may, when loaded into processing system 908 and executed, transform a suitable apparatus, system, or device (of which computing device 901 is representative) overall from a general-purpose computing system into a special-purpose computing system customized to provide enhanced content capture capabilities. Indeed, encoding software 905 on storage system 903 may transform the physical structure of storage system 903. The specific transformation of the physical structure may depend on various factors in different implementations of this description. Examples of such factors may include, but are not limited to, the technology used to implement the storage media of storage system 903 and whether the computer-storage media are characterized as primary or secondary storage, as well as other factors.

For example, if the computer readable storage media are implemented as semiconductor-based memory, software 905 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Communication interface system 907 may include communication connections and devices that allow for communication with other computing systems (not shown) over communication networks (not shown). Examples of connections and devices that together allow for inter-system communication may include network interface cards, antennas, power amplifiers, RF circuitry, transceivers, and other communication circuitry. The connections and devices may communicate over communication media to exchange communications with other computing systems or networks of systems, such as metal, glass, air, or any other suitable communication media. The aforementioned media, connections, and devices are well known and need not be discussed at length here.

Communication between computing device 901 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses and backplanes, or any other type of network, combination of network, or variation thereof. The aforementioned communication networks and protocols are well known and need not be discussed at length here.

User interface system 909 may include a keyboard, a mouse, a voice input device, a touch input device for receiving a touch gesture from a user, a motion input device for detecting non-touch gestures and other motions by a user, and other comparable input devices and associated processing elements capable of receiving user input from a user. Output devices such as a display, speakers, haptic devices, and other types of output devices may also be included in user interface system 909. In some cases, the input and output devices may be combined in a single device, such as a display capable of displaying images and receiving touch gestures. The aforementioned user input and output devices are well known in the art and need not be discussed at length here.

User interface system 909 may also include associated user interface software executable by processing system 902 in support of the various user input and output devices discussed above. Separately or in conjunction with each other and other hardware and software elements, the user interface software and user interface devices may support a graphical user interface, a natural user interface, a conversational user interface, or any other type of user interface.

As will be appreciated by one skilled in the art, aspects of the disclosed technology may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above may be combined in various ways to form multiple embodiments. As a result, the invention is not limited to the specific embodiments described above, but only by the claims and their equivalents.

What is claimed is:

1. A solid-state drive comprising:
   a plurality of memory devices;
   a plurality of dies on each of the plurality of memory devices; and
   a controller coupled with the plurality of memory devices and configured to:
   generate time series data indicative of an accumulation of bad blocks within the plurality of dies and write the time series data to random access memory on the controller;
   send the time series data to a supervisory node external to the solid-state drive; and
   retire a subset of the plurality of dies in response to a command from the supervisory node.

2. The solid-state drive of claim 1, wherein the supervisory node:
   collects the time series data; and
   for at least one die of the plurality of dies:
   identifies one or more behaviors of the at least one die based at least on a portion of the time series data associated with the at least one die; and
   determines to retire the at least one die based at least on one or more of the behaviors identified for the at least one die.

3. The solid-state drive of claim 2, wherein the one or more behaviors of the at least one die comprises a shortening of program erase cycle intervals on the at least one die.

4. The solid-state drive of claim 2, wherein the one or more behaviors of the at least one die comprises an increased count of program erase cycles.

5. The solid-state drive of claim 2, wherein the one or more behaviors of the at least one die comprises a change in a rate of grown defects.

6. The solid-state drive of claim 2, wherein the one or more behaviors of the at least one die comprises exhibiting at least one grown defect associated with at least one uncorrectable read error.

7. The solid-state drive of claim 2, wherein the supervisory node, to identify the one or more behaviors of the at least one die based at least on the portion of the time series data associated with the at least one die, feeds a machine learning model with at least the portion of the time series data associated with the at least one die, resulting in an indication of one or more of a set of possible behaviors.

8. The solid-state drive of claim 7, wherein the indication of the one or more of the set of possible behaviors comprises a prediction of one or more possible failures.

9. The solid-state drive of claim 1, wherein the controller, to retire the subset of the plurality of dies: relocates user data from the subset of the plurality of dies; and marks a plurality of blocks associated with the plurality of dies as unusable, wherein the plurality of blocks comprises a logical subdivision of each of the plurality of dies.

10. The solid-state drive of claim 1 further comprising a host-controller interface that operatively couples the solid-state drive to a host and over which the controller receives the command from the supervisory node.

11. The solid-state drive of claim 1 further comprising a network-controller interface that operatively couples the solid-state drive to a network and over which the controller receives the command from the supervisory node.

12. A method comprising:
in a controller on a solid-state drive:
generating time series data indicative of an accumulation of bad blocks within a plurality of dies on a plurality of memory devices in the solid-state drive;
sending the time series data to a supervisory node external to the solid-state drive in a response to a request from the supervisory node; and
retiring a subset of the plurality of dies in response to a command from the supervisory node.

13. The method of claim 12 further comprising the supervisory node:
collecting the time series data; and
for at least one die of the plurality of dies:
identifying one or more behaviors of the at least one die based at least on a portion of the time series data associated with the at least one die; and
determining to retire the at least one die based at least on one or more identified behaviors of the at least one die.

14. The method of claim 13, wherein the one or more behaviors of the at least one die comprises a shortening of program erase cycle intervals on the at least one die.

15. The method of claim 13, wherein the one or more behaviors of the at least one die comprises an increased count of program erase cycles.

16. The method of claim 13, wherein the one or more behaviors of the at least one die comprises a change in a rate of grown defects.

17. The method of claim 13, wherein the one or more behaviors of the at least one die comprises exhibiting at least one grown defect associated with at least one uncorrectable read error.

18. The method of claim 13, wherein the supervisory node, to identify the one or more behaviors of the at least one die based at least on the portion of the time series data associated with the at least one die, feeds a machine learning model with at least the portion of the time series data associated with the at least one die, resulting in an indication of one or more of a set of possible behaviors.

19. The method of claim 18, wherein the indication of the one or more of the set of possible behaviors comprises a prediction of one or more possible failures.

20. The method of claim 12, wherein retiring the subset of the plurality of dies comprises:
relocating user data from the subset of the plurality of dies; and
marking a plurality of blocks associated with the plurality of dies as unusable, wherein the plurality of blocks comprises a logical subdivision of each of the plurality of dies.

* * * * *